(12) United States Patent
Rodriguez et al.

(10) Patent No.: US 8,994,363 B2
(45) Date of Patent: Mar. 31, 2015

(54) GRID MONITORING SYSTEM AND RELATED METHOD

(75) Inventors: Pedro Rodriguez, Terrassa-Barcelona (ES); Remus Teodorescu, Aalborg (DK)

(73) Assignee: Vestas Wind Systems A/S, Aarhus N (DK)

( * ) Notice: Subject to any disclaimer, the term of this patent is extended or adjusted under 35 U.S.C. 154(b) by 621 days.

(21) Appl. No.: 13/128,132

(22) PCT Filed: Oct. 31, 2009

(86) PCT No.: PCT/DK2009/000229
§ 371 (c)(1),
(2), (4) Date: Jul. 25, 2011

(87) PCT Pub. No.: WO2010/051810
PCT Pub. Date: May 14, 2010

(65) Prior Publication Data
US 2011/0285380 A1 Nov. 24, 2011

Related U.S. Application Data

(60) Provisional application No. 61/112,834, filed on Nov. 10, 2008.

(30) Foreign Application Priority Data

Nov. 7, 2008 (DK) .................. 2008 01535

(51) Int. Cl.
*G01R 23/02* (2006.01)
*G01R 19/25* (2006.01)
(52) U.S. Cl.
CPC .................. *G01R 19/2513* (2013.01)
USPC ...................... 324/76.39; 324/623

(58) Field of Classification Search
USPC ........ 324/76.11, 76.39, 623, 520, 707, 76.78, 324/76.79; 323/202
See application file for complete search history.

(56) References Cited

U.S. PATENT DOCUMENTS

| 4,964,027 A * | 10/1990 | Cook et al. ................... 363/40 |
| 2007/0159265 A1 | 7/2007 | Weng et al. |
| 2010/0213925 A1* | 8/2010 | Teodorescu et al. ....... 324/76.78 |

FOREIGN PATENT DOCUMENTS

WO   WO 2008/055499   5/2008

OTHER PUBLICATIONS

Rodriguez et al., "Advanced Grid Synchronization System for Power Converters under Unbalanced and Distorted Operating Conditions" IEEE, pp. 5173-5178, Nov. 1, 2006.
Rodriguez et al., "Grid Synchronization of Power Converters using Multiple Second Order Generalized Integrators" IEEE, pp. 755-760, Nov. 10, 2008.
Rodriguez et al., "Multiple Second Order Generalized Integrators for Harmonic Synchronization of Power Converters" IEEE, pp. 2239-2246, Sep. 20, 2009.
International Search Report for Application No. PCT/DK2009/000229, dated Apr. 21, 2010.

* cited by examiner

*Primary Examiner* — Vincent Q Nguyen
(74) *Attorney, Agent, or Firm* — Patterson & Sheridan, LLP

(57) ABSTRACT

The present invention relates to a grid monitoring system, in particular a grid monitoring system enabling real-time monitoring of grid variables, e.g. voltage and current, in electrical power systems, such as single or three-phase networks. The grid monitoring system includes a harmonic detection unit being adapted to subtract harmonics of an input signal before feeding the input signal to a plurality of signal generators in the harmonic detection unit.

18 Claims, 16 Drawing Sheets

GRID MONITORING SYSTEM AND RELATED METHOD

The present invention relates to a grid monitoring system and related method, in particular a grid monitoring system enabling real-time monitoring of grid variables, e.g. voltage and current, in electrical power systems, such as single or three-phase networks.

BACKGROUND

One of the most important issues in the control of advanced grid connected equipments such as line interactive power processors, intelligent protection systems, and power quality monitors and analyzers is the synchronization with the power signals, i.e., voltage signal(s) and/or current signal(s). Grid voltage waveforms are sinusoidal and balanced under optimal operating conditions, but they are prone to be distorted and unbalanced as a consequence of the effect of nonlinear loads on the grid and grid faults. On its part, line currents are perfectly sinusoidal and balanced only in the case of ideal grids consisting of perfectly balanced linear loads. Therefore, grid-connected equipments should be properly synchronized with the grid variables to stay actively connected under generic operating conditions.

The phase-locked technology has been used during decades in communications, military and aerospace systems to synchronize a local oscillator with some recognizable external signal. Following these examples, advanced grid-connected equipments have conventionally used a phase-locked loop (PLL) to synchronize its internal control system to the grid voltage or current. In three-phase systems, the PLL based on a synchronous reference frame (SRF-PLL) has become a conventional grid synchronization technique. However, the response of the SRF-PLL is unacceptably deficient when the utility voltage is unbalanced.

WO 2008/055499 discloses a real-time grid monitoring system and method based on a frequency locking loop (FLL).

There is still a need for improving grid monitoring systems.

SUMMARY

It is an object to provide an improved grid monitoring system having improved response.

According to the invention, the above-mentioned and other objects are fulfilled by a grid monitoring system comprising a first harmonic detection unit and a frequency locking loop unit each having at least one input and at least one output, the first harmonic detection unit having a first input for receiving a first input signal, and a second input connected to the frequency locking loop unit for receiving a control signal. An input of the frequency locking loop unit is connected to at least one output of the first harmonic detection unit for receiving a feedback signal, the first harmonic detection unit being configured for detecting a first frequency component and a second frequency component of the first input signal, wherein the first harmonic detection unit being configured for feeding the first frequency component and the second frequency component to a first output and a second output, respectively, of the first harmonic detection unit. The first harmonic detection unit comprises a first signal generator, a second signal generator and a cross feedback network. The first signal generator has a first input connected to a first output of the cross feedback network, and a first output connected to a first output of the first harmonic detection unit and to a first input of the cross feedback network. The second signal generator has a second input connected to a second output of the cross feedback network, and a second output connected to a second output of the first harmonic detection unit and to a second input of the cross feedback network. The cross feedback network may be configured to subtract the second frequency component from the first input signal and feed the resulting signal to the first input of the first signal generator, and the cross feedback network may be configured to subtract the first frequency component from the input signal and feed the resulting signal to the second input of the second signal generator.

It is an advantage of the grid monitoring system (GMS) according to the present invention that real-time monitoring of harmonics in power signal(s) is provided.

It is a further advantage that harmonics detection in the GMS according to the invention is not based on the Fourier analysis, thereby reducing computational requirements.

Further, the GMS provides high precision monitoring of single or three-phase power systems independently of the harmonic content of the processed power signals. This feature can be achieved thanks to the harmonic detection unit(s), which allows processing the different harmonics of the power signal independently. In existing monitoring solutions for three-phase network, harmonics are treated as interferences to be filtered.

BRIEF DESCRIPTION OF THE DRAWINGS

The above and other features and advantages of the present invention will become readily apparent to those skilled in the art by the following detailed description of exemplary embodiments thereof with reference to the attached drawings, in which.

DETAILED DESCRIPTION

Figure 1:
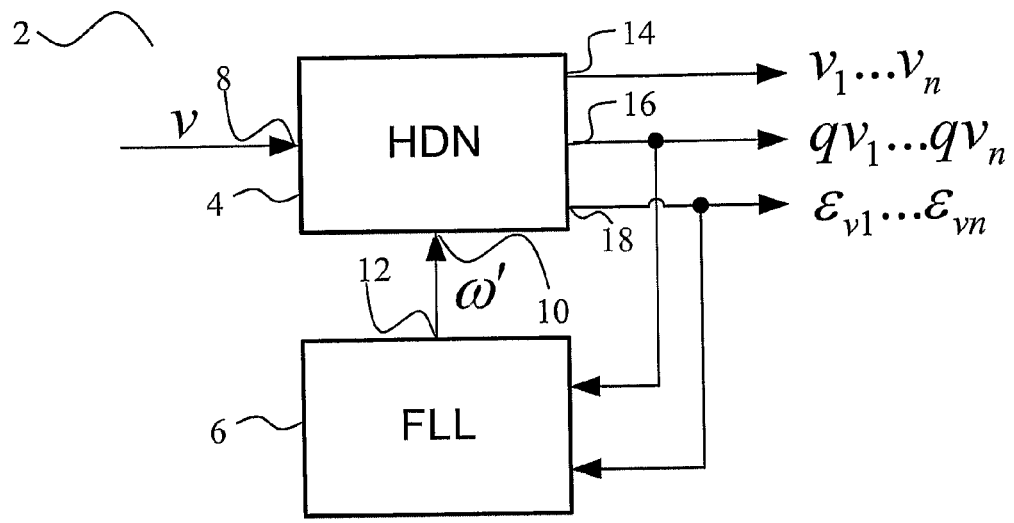
FIG. 1 shows a block diagram of a single phase implementation of the grid monitoring system of the present invention.

The grid monitoring system (GMS) according to the present invention comprises a first harmonic detection unit and a frequency locking loop unit each having at least one input and at least one output.

The grid monitoring system may comprise a second harmonic detection unit having at least one input and at least one output.

Further, the grid monitoring system may comprise a third harmonic detection unit having at least one input and at least one output.

The harmonic detection unit(s) may comprise a first input for feeding an input signal to the harmonic detection unit(s), and a second input.

The second input of the respective harmonic detection units may be connected, either directly or via an amplifier unit, to a control input of the first signal generator in the respective harmonic detection units, e.g. the second input of the first harmonic detection unit may be connected to a control input of the first signal generator of the first harmonic detection unit.

The harmonic detection unit(s) may comprise one or more amplifier units having an input connected to the second input of the respective harmonic detection unit, and an output connected to a control input of a signal generator. For example, the first harmonic detection unit or the second harmonic detection unit or both may comprise an amplifier unit having an input connected to the second input of the respective harmonic detection unit and an output connected to a control input of the second signal generator. The amplifier units may have different gains. One or more of the gains may be integers, e.g. for tuning the signal generators to harmonic frequencies. Additionally, or alternatively, one or more gains may be a non-integer thereby enabling analysis of inter-harmonics of the input signal.

The signal generators employed in the system may be any suitable signal generator. Preferably, the signal generators are quadrature signal generators generating a first output signal on the first output and a second output signal, e.g. a quadrature signal, on a second output. The second output of the signal generators may be connected to a corresponding quadrature output of the harmonic detection unit.

For example, the first signal generator of respective harmonic detection unit(s) may be a quadrature signal generator generating a first output signal on the first output and a second output signal on a second output connected to a first quadrature output of the respective harmonic detection unit(s).

The quadrature signal generator may comprise a second order generalized integrator (SOGI). The signal generator may comprise an amplifier unit with gain k. The gain k may be a constant, for example k=$\sqrt{2}$. Different values of k may be selected for different signal generators. For example, the first signal generator may have a first k-value and the second signal generator may have a second k-value. The value of k may be selected depending on the frequency of the harmonic on the first input of the signal generator.

In an embodiment, the gains $k_i$ of the signal generators are given by:

$$k_i = \frac{k_1}{i},$$

where i indicates the number of the harmonic to be generated in the signal generator and $k_1$ is a constant, e.g. $k_1=\sqrt{2}$.

The signal generators may comprise a third output, e.g. for feeding an error signal to an error output of a harmonic detection unit. Accordingly, the first signal generator of respective harmonic detection unit(s) may comprise a third output connected to a first error output of the respective harmonic detection unit(s).

The grid monitoring system may comprise a second harmonic detection unit having at least one input and at least one output, the second harmonic detection unit having a first input for receiving a second input signal, a second input connected to the frequency locking loop unit for receiving a control frequency, wherein an input of the frequency locking loop unit is connected to at least one output of the second harmonic detection unit for receiving a feedback signal, the second harmonic detection unit being configured for detecting a first frequency component and a second frequency component of the second input signal on the first input of the second harmonic detection unit. The second harmonic detection unit may be configured for feeding the first frequency component and the second frequency component to a first output and a second output, respectively, of the second harmonic detection unit. The second harmonic detection unit may comprise a first signal generator, a second signal generator and optionally a cross feedback network, the first signal generator having a first input connected to a first output of the cross feedback network and a first output connected to a first output of the second harmonic detection unit and to a first input of the cross feedback network. The second signal generator may have a second input connected to a second output of the cross feedback network and a second output connected to a second output of the second harmonic detection unit and to a second input of the cross feedback network. The cross feedback network may be configured to subtract the second frequency component from the second input signal and feed the resulting signal to the first input of first signal generator, and the cross feedback network may be configured to subtract the first frequency component from the second input signal and feed the resulting signal to the second input of second signal generator.

The grid monitoring system may comprise a positive-negative sequence calculator unit connected to outputs of the first and second harmonic detection units and being configured to provide the positive and negative-sequence components at the first and second frequencies.

The frequency locking loop unit provides a control frequency to one or more of the harmonic detection unit(s) of the grid monitoring system. One or more inputs of the frequency locking loop unit may be connected to selected or all of the quadrature outputs of the first harmonic detection unit. Further, one or more inputs of the frequency locking loop unit may be connected to selected or all of the quadrature outputs of the second and/or third harmonic detection unit. Thus, the control frequency may be adapted based on one or more quadrature signals forming a closed feedback loop.

One or more inputs of the frequency locking loop unit may be connected to selected or all of the error outputs of the first harmonic detection unit. Further, one or more inputs of the frequency locking loop unit may be connected to selected or all of the error outputs of the second and/or third harmonic detection unit. Thus, the control frequency may be adapted based on one or more error signals forming a closed feedback loop.

The frequency locking loop unit may be a linearized frequency locking loop unit.

The linearized frequency locking loop unit (LFLL) may have a suitable transfer function for setting the performance of the frequency adaptive loop according to the desired dynamics.

The LFLL may have a number of quadrature inputs connected to one or more of the quadrature outputs of harmonic detection unit(s), and a number of error inputs connected to one or more of the error outputs of harmonic detection unit(s). The quadrature input(s) and/or the error input(s) may be connected in different configurations according to number of harmonics, number of input signals to the system and the desired feedback to the LFFL.

The LFLL may comprise a series of partial frequency error detectors at the frequencies of interest on the α and β components of the monitored three-phase input vector. This partial frequency errors detectors, both for α and β components, may be implemented by multipliers, having a first input port to which the in-phase error signal from the substractor of the QSG tuned at the frequency of interest is coupled, a second input port to which the filtered in-quadrature output signal of the QSG tuned at the frequency of interest is coupled, and an output port providing a partial inner frequency error signal, wherein the output port of the multiplier is coupled to a frequency error aggregation unit (FEA).

The grid monitoring system may comprise a transformation unit having at least one input and at least one output and being configured for transforming the signal(s) on the at least one input to signal(s) on the at least one output according to a transformation. The output(s) of the transformation unit may be connected to inputs of harmonic detection unit(s).

The figures are schematic and simplified for clarity, and they merely show details which are essential to the understanding of the invention, while other details have been left out. Throughout, the same reference numerals are used for identical or corresponding parts.

FIG. 1 shows a block diagram of a single phase implementation of the grid monitoring system of the present invention. The grid monitoring system 2 comprises a first harmonic detection unit (HDN) 4 and a frequency locking loop unit (FLL) 6. A first input signal v is fed to a first input 8 of the first harmonic detection unit 4 and a second input 10 is connected to a first output 12 of the frequency locking loop unit 6 for receiving a control signal ω', i.e. the control frequency. The control frequency ω' is adapted during operation of the grid monitoring system and may be about $2\pi \cdot f$ where f e.g. is about 50 Hz or about 60 Hz. The first harmonic detection unit has a first and a second output (shown as vectorized output 14) for outputting a first frequency component signal $v_1$ and a second frequency component signal $v_2$, respectively. The first harmonic detection unit 4 may be configured for detecting any number of frequency component signals $v_1 \ldots v_n$. Further in the illustrated embodiment, the first harmonic detection unit 4 generates a number of quadrature signals $qv_1 \ldots qv_n$ on quadrature outputs 16 at or around frequencies being integer multiples of the control frequency ω' and a number of error signals $\epsilon_{v1} \ldots \epsilon_{vn}$ on error outputs 18 of the first harmonic detection unit 4. One or more of the quadrature outputs of the HDN are connected to inputs of the FLL for feeding one or more of the signals $qv_1 \ldots qv_n$ to the FLL. One or more of the error outputs of the HDN are connected to inputs of the FLL for feeding one or more of the error signals $\epsilon_{v1} \ldots \epsilon_{vn}$ to the FLL. For simplicity, the outputs 14, the quadrature outputs 16 and the error outputs 18 of the harmonic detection unit 4 is illustrated as vectors.

Figure 2:
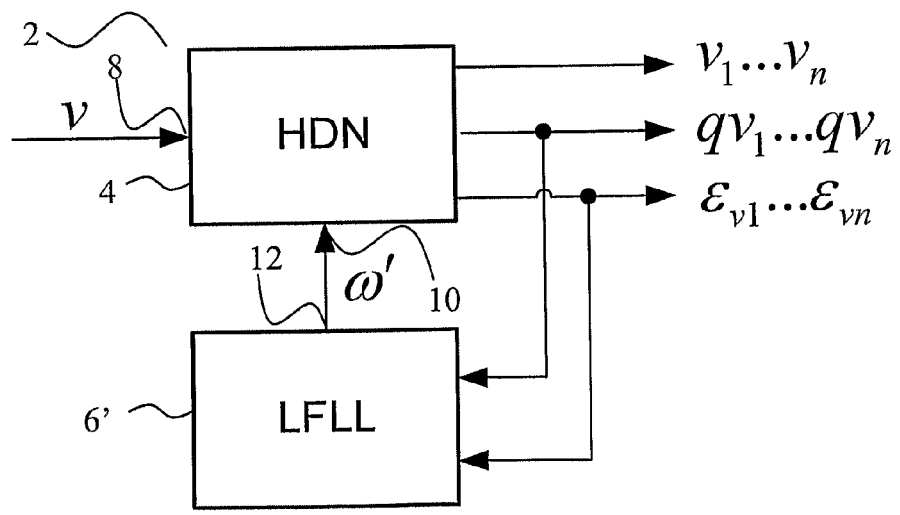
FIG. 2 shows a block diagram of a single phase implementation of the grid monitoring system of the present invention.

FIG. 2 illustrates a block diagram of a single phase implementation of the grid monitoring system of the present invention. The grid monitoring system 2' comprises a first harmonic detection unit (HDN) 4 and a linearized frequency locking loop unit (LFLL) 6'.

Figure 3:
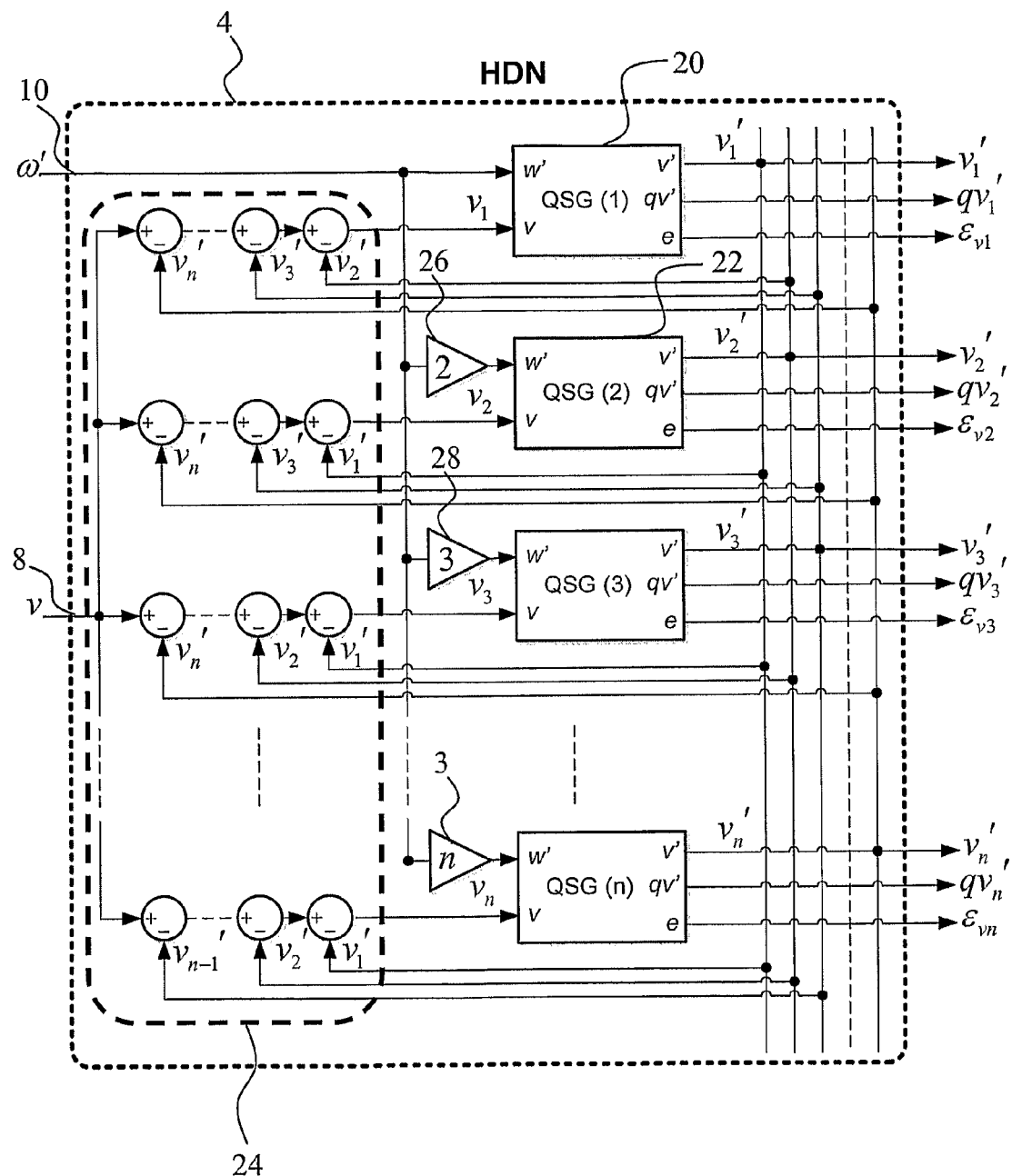
FIG. 3 shows a block diagram of a harmonic detection unit.

FIG. 3 illustrates an embodiment of a harmonic detection unit employed in the GMS according to the present invention. The first harmonic detection unit (HDN) 4, comprises a number of signal generators QSG(1) ... QSG(n) including a first signal generator 20, a second signal generator 22, and a cross feedback network 24. The first signal generator 20 has a first input v connected to a first output of the cross feedback network, and a first output v' connected to a first output of the first harmonic detection unit and to a first input of the cross feedback network. The second signal generator 22 has a second input v connected to a second output of the cross feedback network, and a second output v' connected to a second output of the first harmonic detection unit and to a second input of the cross feedback network. The cross feedback network 24 is configured to subtract the second frequency component from the first input signal v and feed the resulting signal to the first input v of the first signal generator, and the cross feedback network 24 is configured to subtract the first frequency component from the input signal v and feed the resulting signal to the second input v of the second signal generator 22. The first harmonic detection unit 4 may comprise any number n of signal generators, e.g. the number of signal generators may be two, three, four, five, six or more, depending on the desired number of frequency components or harmonics. The cross feedback network 24 may be configured to implement any suitable subtraction of frequency component signals.

The cross feedback network comprises one or more subtractors and is configured for implementing the desired cross feedback structure.

In the embodiment of the cross feedback network illustrated in FIG. 3, the output in vector form from the cross feedback network 24 is given as $$\begin{bmatrix} v_1 \\ v_2 \\ \vdots \\ v_n \end{bmatrix} = \begin{bmatrix} 1 \\ 1 \\ \vdots \\ 1 \end{bmatrix} v + \begin{bmatrix} 0 & -1 & \ldots & -1 \\ -1 & 0 & \ldots & -1 \\ \vdots & \vdots & \ddots & -1 \\ -1 & -1 & \ldots & 0 \end{bmatrix} \times \begin{bmatrix} v'_1 \\ v'_2 \\ \vdots \\ v'_n \end{bmatrix}$$

where $v'_1, v'_2, \ldots, v'_n$ are the first outputs from signal generators QSG(1) to QSG(n).

Each of the signal generators are tuned to desired frequencies being integer multiples of the control frequency ω'. Thus, the second input 10 of the first harmonic detection unit is connected to a control input of the first signal generator.

The first harmonic detection unit 4 comprises one or more amplifier units 26, 28, 30 including an amplifier unit 26 having an input connected to the second input 10 of the first harmonic detection unit 4 and an output connected to a control input w' of the second signal generator 22. The gain of the amplifier units depend on the harmonics of interest.

In an embodiment of the present invention, the harmonic detection unit comprises an amplifier unit having an input connected to the second input of the first harmonic detection unit and an output connected to a control input of the first signal generator.

Figure 4:
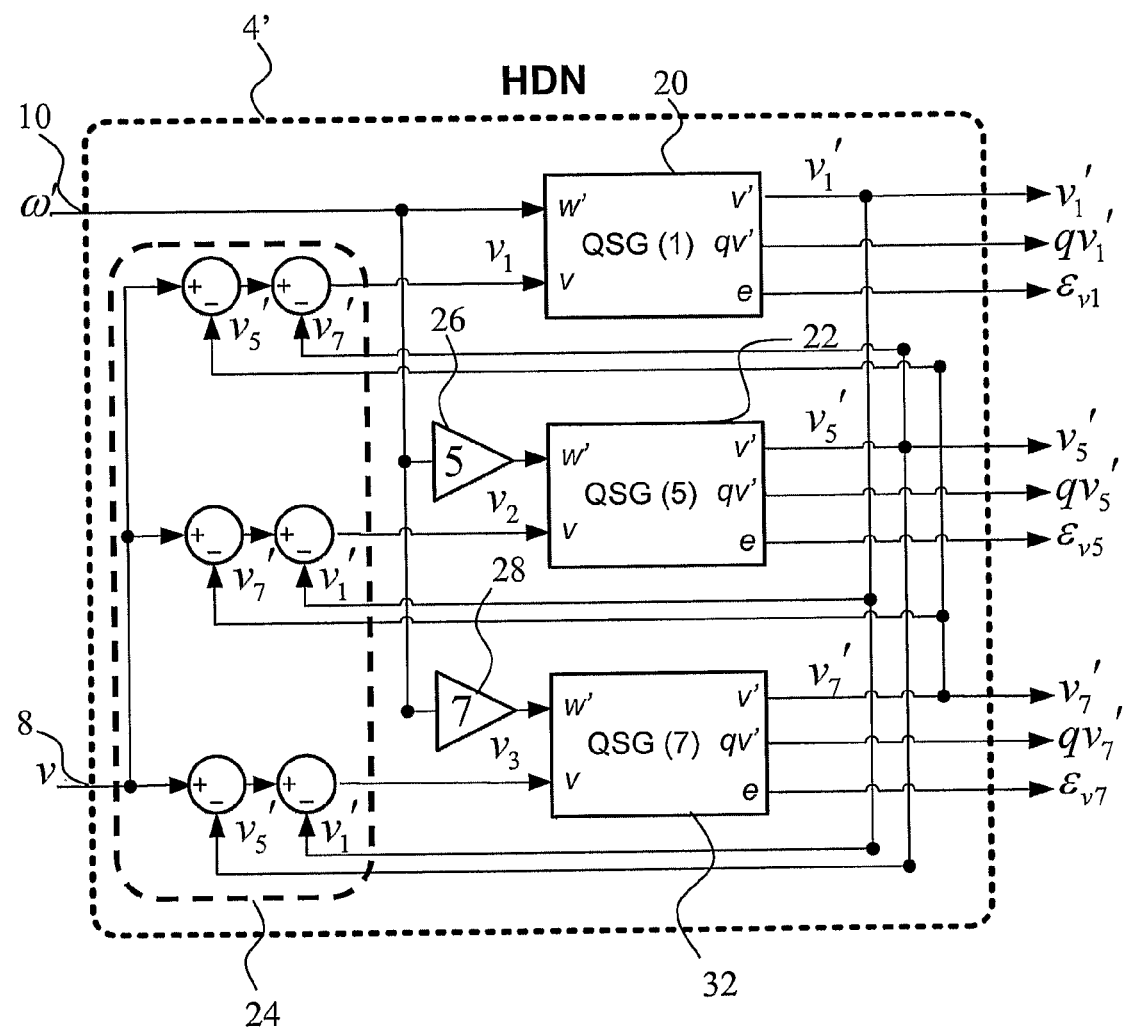
FIG. 4 shows a block diagram of a harmonic detection unit.

FIG. 4 illustrates a harmonic detection unit having three signal generators 20, 22, 32 being tuned to desired frequencies. In this case the signal generators are tuned to the first harmonic, the fifth harmonic, and the seventh harmonic, i.e. the gain of the amplifier units 26, 28 are set to five and seven, respectively.

The gain of the amplifier unit(s) such as amplifier units 26, 28 in the harmonic detection unit may be a non-integer, e.g. in order to be able to track interharmonics, i.e. harmonics with a noninteger order.

In the embodiment of the cross feedback network illustrated in FIG. 4, the output in vector form from the cross feedback network 24 is given as $$\begin{bmatrix} v_1 \\ v_5 \\ v_7 \end{bmatrix} = \begin{bmatrix} 1 \\ 1 \\ 1 \end{bmatrix} v + \begin{bmatrix} 0 & -1 & -1 \\ -1 & 0 & -1 \\ -1 & -1 & 0 \end{bmatrix} \times \begin{bmatrix} v'_1 \\ v'_5 \\ v'_7 \end{bmatrix}$$

In an embodiment with two signal generators, the output in vector form from the cross feedback network 24 may be given as given as $$\begin{bmatrix} v_1 \\ v_2 \end{bmatrix} = \begin{bmatrix} 1 \\ 1 \end{bmatrix} v + \begin{bmatrix} 0 & -1 \\ -1 & 0 \end{bmatrix} \times \begin{bmatrix} v'_1 \\ v'_2 \end{bmatrix}$$

In an embodiment with four signal generators, the output in vector form from the cross feedback network 24 may be given as given as $$\begin{bmatrix} v_1 \\ v_2 \\ v_3 \\ v_4 \end{bmatrix} = \begin{bmatrix} 1 \\ 1 \\ 1 \\ 1 \end{bmatrix} v + \begin{bmatrix} 0 & -1 & -1 & -1 \\ -1 & 0 & -1 & -1 \\ -1 & -1 & 0 & -1 \\ -1 & -1 & -1 & 0 \end{bmatrix} \times \begin{bmatrix} v'_1 \\ v'_2 \\ v'_3 \\ v'_4 \end{bmatrix}$$

One or more subtractors may be omitted in the cross feedback network. For example, the cross feedback network may be configured to subtract selected harmonics, e.g. as illustrated by the following equation:

$$\begin{bmatrix} v_1 \\ v_2 \\ v_3 \\ v_4 \end{bmatrix} = \begin{bmatrix} 1 \\ 1 \\ 1 \\ 1 \end{bmatrix} v + \begin{bmatrix} 0 & -1 & 0 & 0 \\ -1 & 0 & -1 & 0 \\ 0 & -1 & 0 & -1 \\ 0 & 0 & -1 & 0 \end{bmatrix} \times \begin{bmatrix} v'_1 \\ v'_2 \\ v'_3 \\ v'_4 \end{bmatrix}$$

The GMS according to the present invention allows real-time monitoring of harmonics in single, two or three-phase power signals using a vector approach that allows splitting the harmonics into their sequence components.

The GMS is based on detecting the frequency of the processed signal and does not use any synchronous reference frame. This means that the response of the GMS is more stable than that obtained by other systems based on the phase-angle detection, i.e., systems based on synchronous reference frames, since the grid frequency is more stable than the phase-angle of the processed signal.

Figure 5:
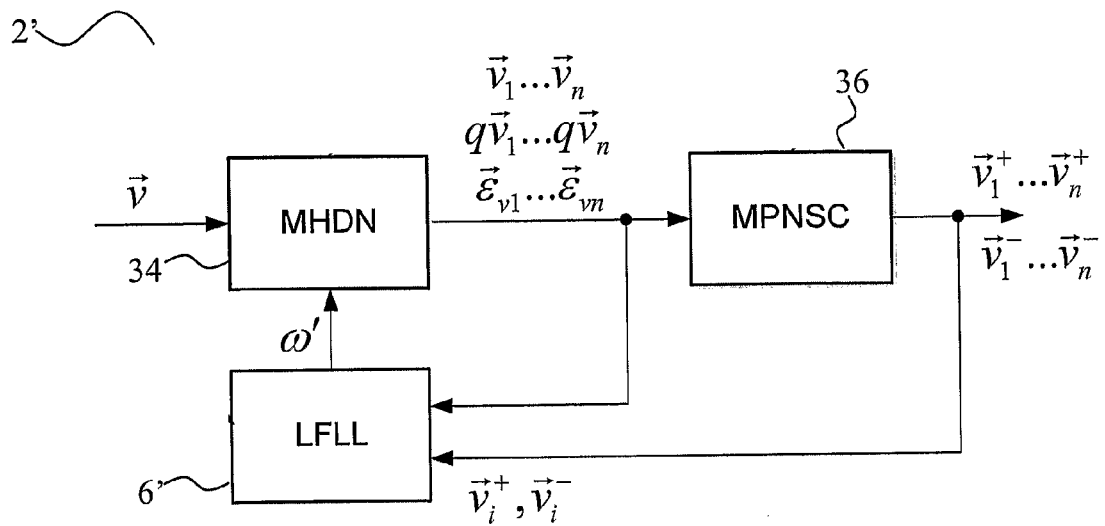
FIG. 5 shows a block diagram of a multi phase implementation of the grid monitoring system of the present invention.

FIG. 5 schematically illustrates a block diagram of a multi-phase implementation of the grid monitoring system. The outputs from a multiple harmonic detection unit (MHDN) 34 comprising a plurality of harmonic detection units, e.g. as described in connection with FIGS. 3 and 4, are connected to a multi-positive-negative-sequence calculator unit (MPNSC) 36 and the frequency locking loop unit (LFLL) 6'.

Figure 6:
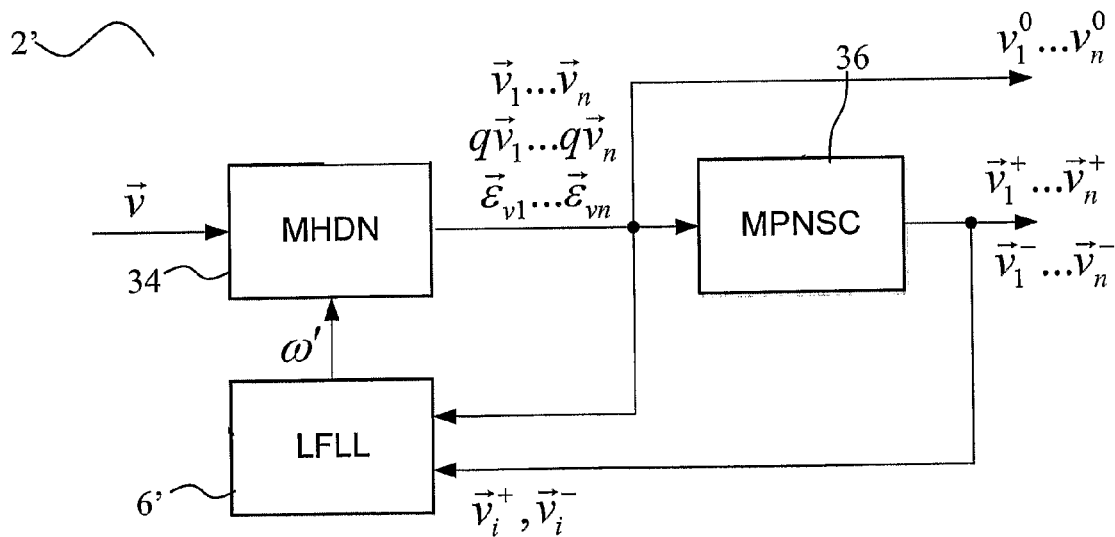
FIG. 6 shows a block diagram of a multi phase implementation of the grid monitoring system of the present invention.

FIG. 6 schematically illustrates a block diagram of a multi-phase implementation of the grid monitoring system. The outputs from a multiple harmonic detection unit (MHDN) 34 comprising a plurality of harmonic detection units, e.g. as described in connection with FIGS. 3 and 4, are connected to a multi-positive-negative-sequence calculator unit (MPNSC) 36 and the frequency locking loop unit (LFLL) 6'. The zero-sequence of the input signal is derived from the output of the MHDN.

Figure 7:
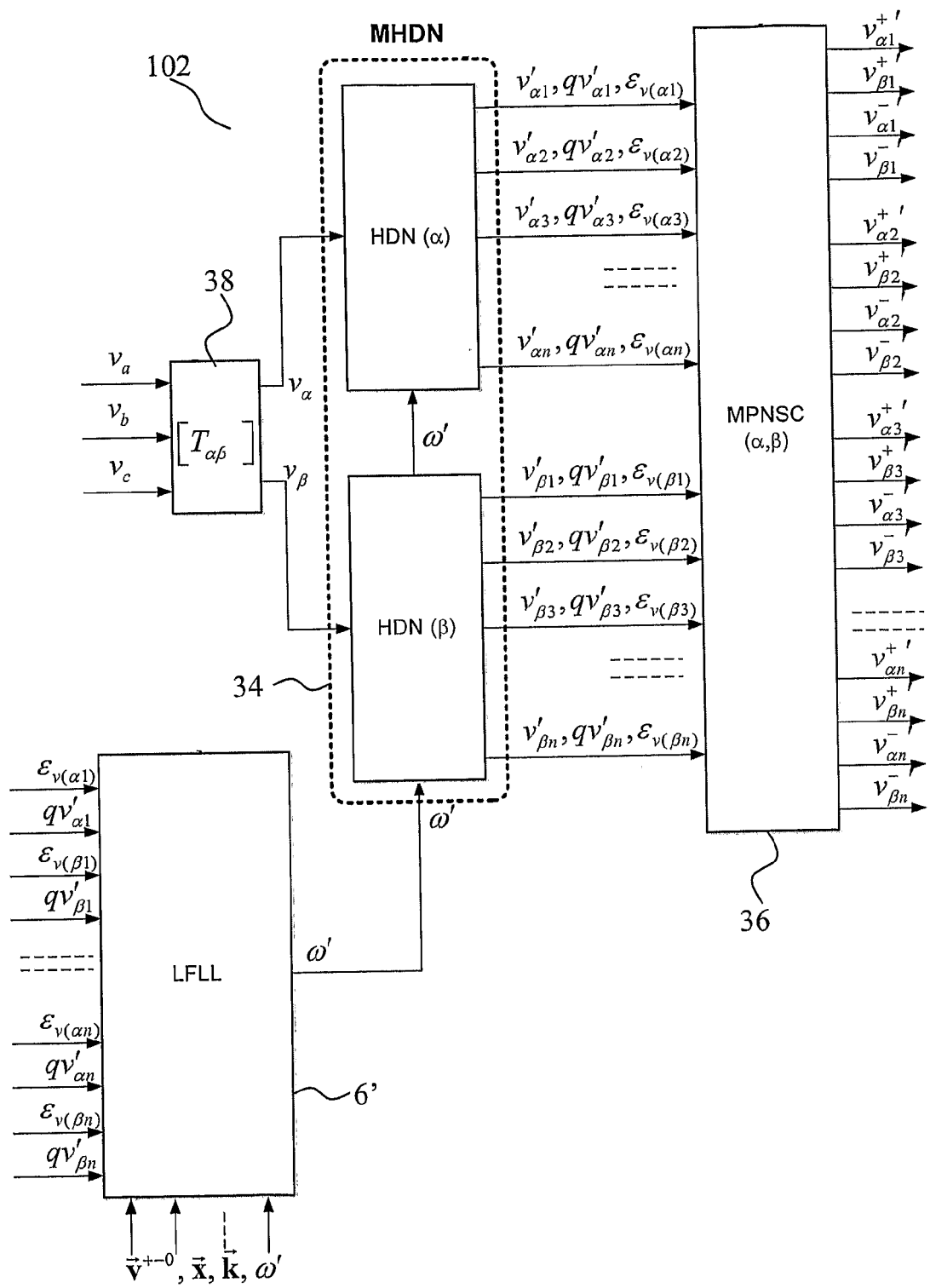
FIG. 7 shows a block diagram of a multi phase implementation of the grid monitoring system of the present invention.

FIG. 7 shows a more detailed block diagram of a three-phase implementation of the GMS. The GMS 102 comprises a transformation unit 38 having a three-phase signal as input and being configured for transforming the input signals $v_a$, $v_b$, $v_c$ according to the Clarke transformation $\lfloor T_{\alpha\beta} \rfloor$ and feeds the transformed signals $v_\alpha$, $v_\beta$ to the MHDN 34.

The Clarke transformation is given by:

$$\begin{bmatrix} s_\alpha \\ s_\beta \end{bmatrix} = c \begin{bmatrix} 1 & -\frac{1}{2} & -\frac{1}{2} \\ 0 & \frac{\sqrt{3}}{2} & -\frac{\sqrt{3}}{2} \end{bmatrix} \cdot \begin{bmatrix} s_a \\ s_b \\ s_c \end{bmatrix}$$

If extended with a zero system, the Clarke transformation $\lfloor T_{\alpha\beta 0} \rfloor$ matrix notation is given by $$\begin{bmatrix} s_\alpha \\ s_\beta \\ s_o \end{bmatrix} = c \begin{bmatrix} 1 & -\frac{1}{2} & -\frac{1}{2} \\ 0 & \frac{\sqrt{3}}{2} & -\frac{\sqrt{3}}{2} \\ \frac{\sqrt{2}}{2} & \frac{\sqrt{2}}{2} & \frac{\sqrt{2}}{2} \end{bmatrix} \cdot \begin{bmatrix} s_a \\ s_b \\ s_c \end{bmatrix},$$

where c is a constant. If the value $$c = \frac{2}{3}$$

is chosen, the length of the voltage and current vectors are maintained. If, instead the value $$c = \sqrt{\frac{2}{3}}$$

is selected, then power calculated in the αβ-frame is the same as in the abc-frame, and the αβ-system is said to be power invariant.

The MHDN comprises a first harmonic detection unit (HDN(α)) and a second harmonic detection unit (HDN(β)), e.g. the first harmonic detection unit (HDN(α)) and the second harmonic detection unit (HDN(β)) may harmonic detection units as described in connection with FIG. 3 and/or FIG. 4. The output $v_\alpha$ of the transformation unit 38 is fed to the first input of HDN(α) and the output $v_\beta$ is fed to the first input of HDN(β).

The outputs $\vec{v}_1 \ldots \vec{v}_n$, $q\vec{v}_1 \ldots q\vec{v}_n$, and $\vec{\epsilon}_{v1} \ldots \vec{\epsilon}_{vn}$ of the MHDN 34 (vectors due to the plurality of harmonic detection units in the MHDN) are fed to the multi-positive-negative-sequence calculator unit (MPNSC) 36 and to the linearized frequency locking loop unit (LFLL) 6'. In an embodiment, only selected outputs are fed to the LFLL 6'

The LFLL 6' calculates and adapts the control frequency ω' based on the output of the MHDN 34. Further, the output of the MPNSC 36 may be fed back to the LFLL 6'. The LFLL 6' and the operation thereof will be described in further detail below.

Figure 8:
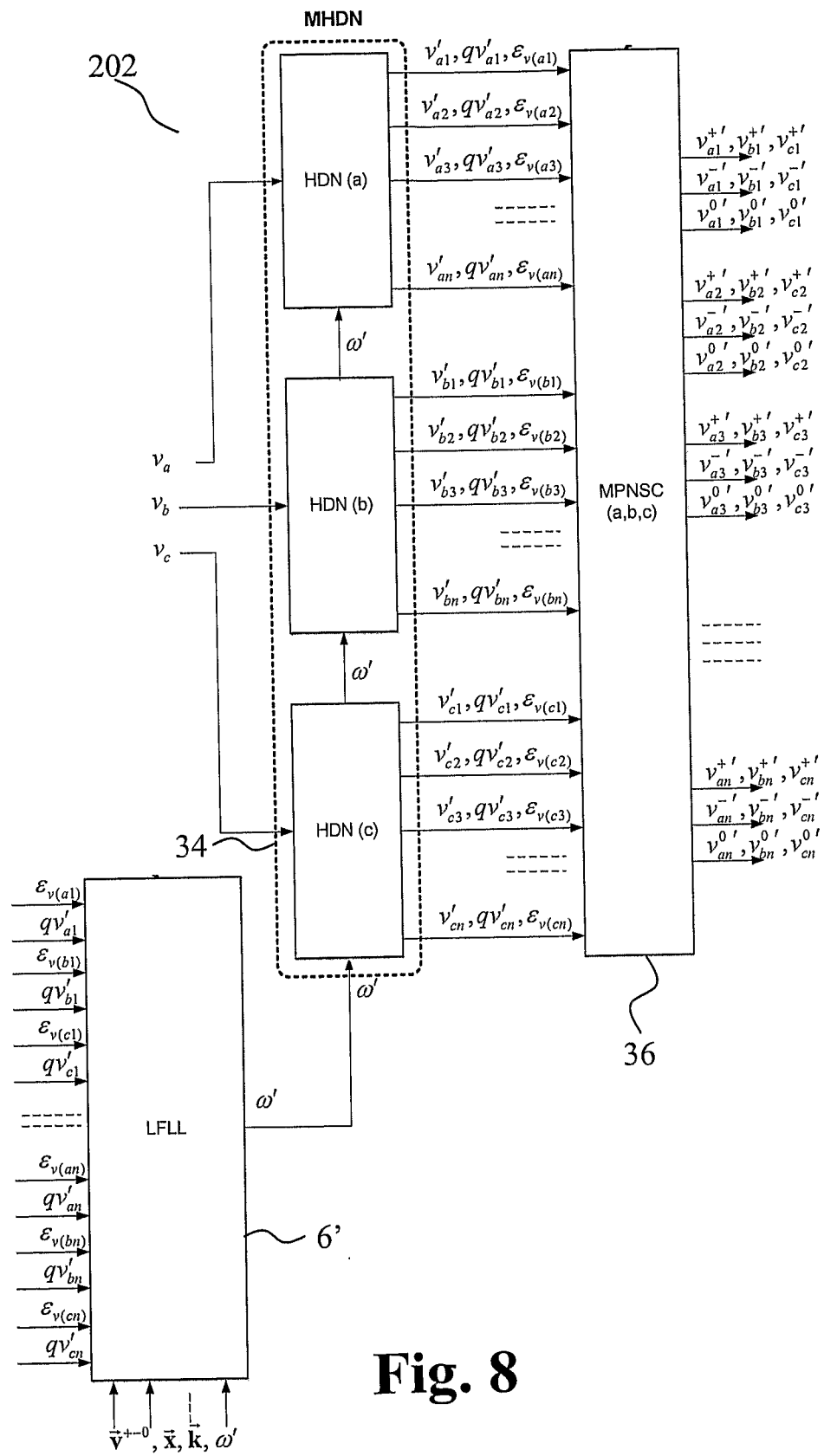
FIG. 8 shows a block diagram of a multi phase implementation of the grid monitoring system of the present invention.

FIG. 8 shows a more detailed block diagram of a three-phase implementation of the GMS. The GMS 202 is fed by three single-phase signals $v_a$, $v_b$, $v_c$. The MHDN 34 comprises three harmonic detection units (HDN(a), HDN (b), HDN(c)). The MPNSC 36 calculates the positive and negative sequence for all three phases a, b and c.

Figure 9:
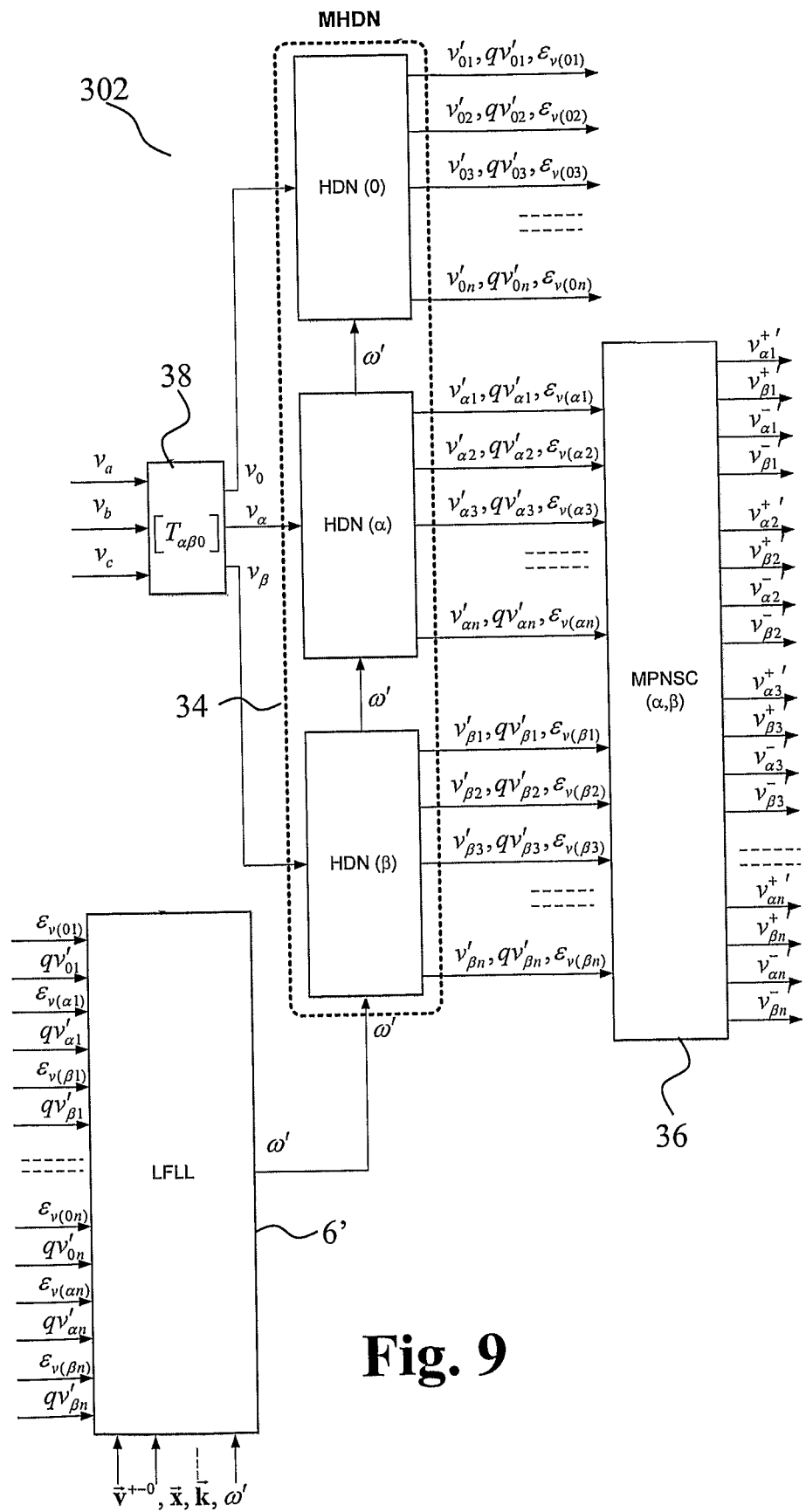
FIG. 9 shows a block diagram of a multi phase implementation of the grid monitoring system of the present invention.

FIG. 9 shows a more detailed block diagram of a three-phase implementation of the GMS. The GMS 302 comprises a transformation unit 38 having a three-phase signal $v_a$, $v_b$, $v_c$ as input and being configured for transforming the input signals $v_a$, $v_b$, $v_c$ according to the an extended Clarke transformation $\lfloor T_{\alpha\beta 0}\rfloor$ and feeds the transformed signals $v_\alpha$, $v_\beta$, $v_0$ to the MHDN 34. The MHDN 34 comprises three harmonic detection units (HDN ($\alpha$), HDN ($\beta$), HDN (0). The MPNSC 36 calculates the positive and negative sequence for $\alpha$ and $\beta$.

Figure 10:
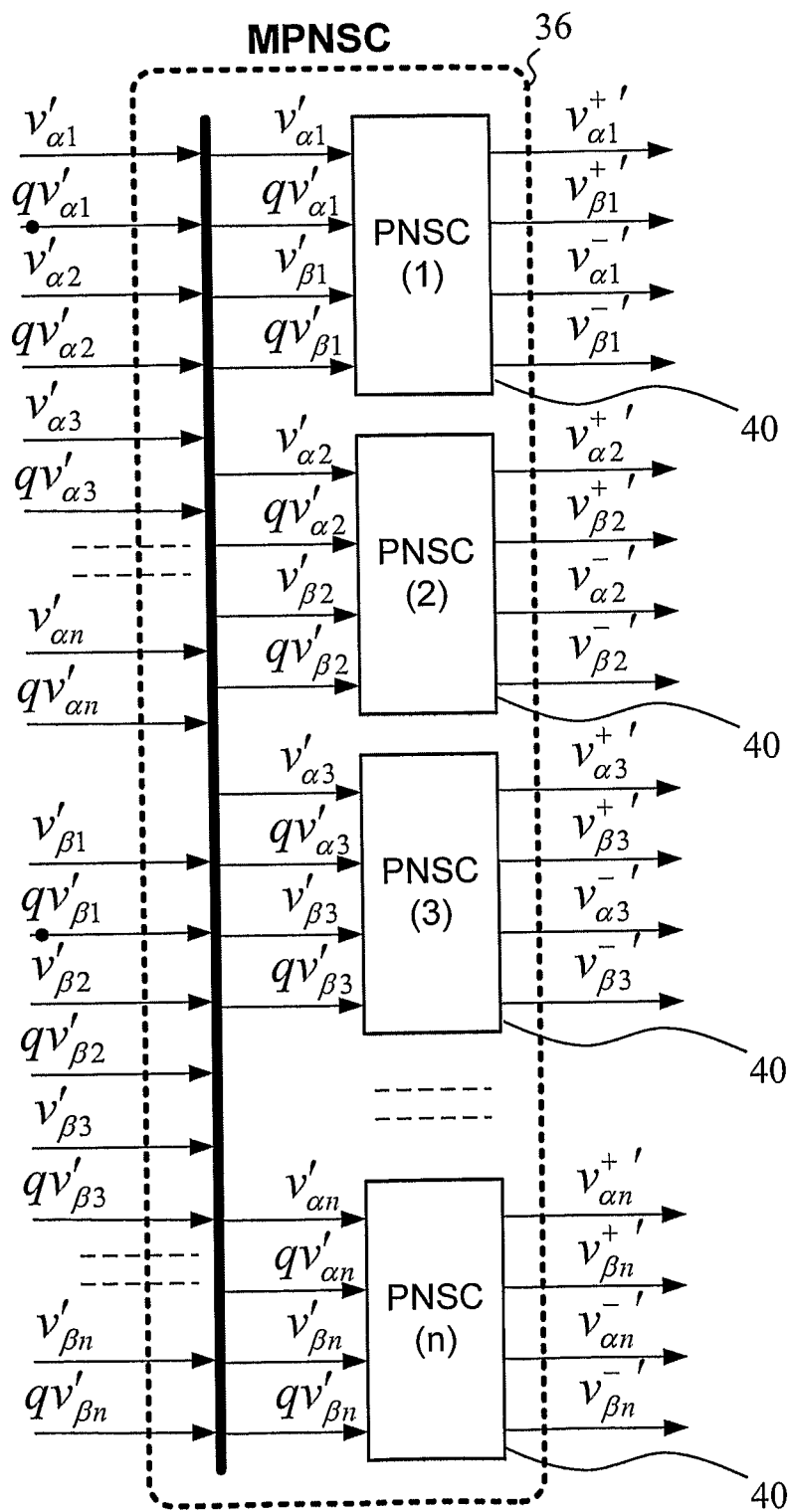
FIG. 10 shows a block diagram of a positive-negative sequence calculator unit.

FIG. 10 illustrates a more detailed diagram of a multi-positive-negative-sequence calculator unit (MPNSC) 36. The MPNSC comprises a number of positive-negative sequence calculators 40 (PNSC (1), . . . , PNSC (n)), one for each frequency of interest. In the illustrated embodiment, the outputs of the MPNSC 36 provide the positive and negative-sequence components at the frequencies of interest of the monitored input vector on the $\alpha$, $\beta$ reference frame.

Figure 11:
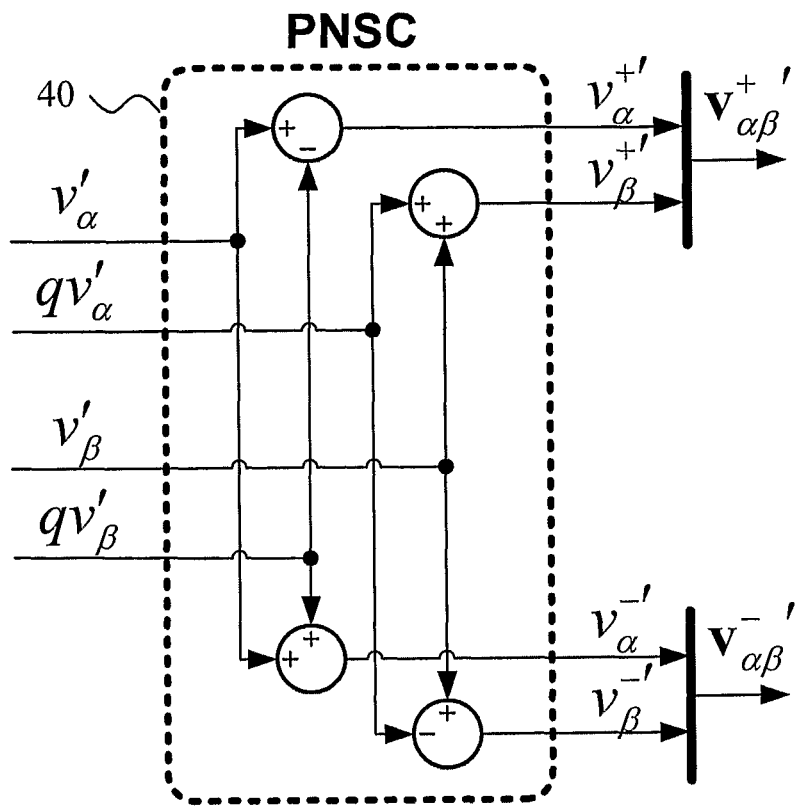
FIG. 11 shows a block diagram of a positive-negative sequence calculator.

FIG. 11 shows a block diagram of the positive-negative-sequence calculator (PNSC) 40 on the $\alpha\beta$ reference frame. The PNSC 40 receives two sets of in-quadrature signals at the input.

Figure 12:
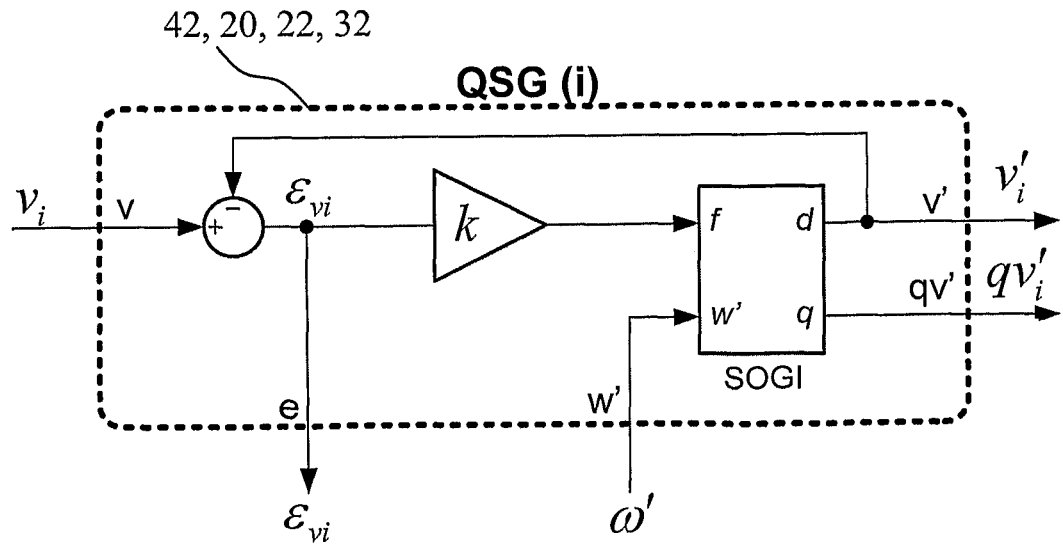
FIG. 12 shows a block diagram of a quadrature signal generator.

FIG. 12 illustrates an embodiment of a signal generator. The signal generator 42, 20, 22, 32 is a quadrature signal generator (QSG(i)) adapted to generate a first output signal $v'_i$ on a first output v', a second output signal $qv'_i$ on a second output qv', and a third output signal $\epsilon_{vi}$ on a third output e. The signal generator 42, 20, 22, 32 receives input $v_i$ on a first input v and a control signal $\omega'$ on a second input w'. The exemplary and preferred signal generator illustrated in FIG. 12 is a SOGI-based signal generator implemented as an adaptive band-pass filter, where input $\omega'$ sets the tuning frequency and gain k sets the damping factor of the signal generator.

Figure 13:
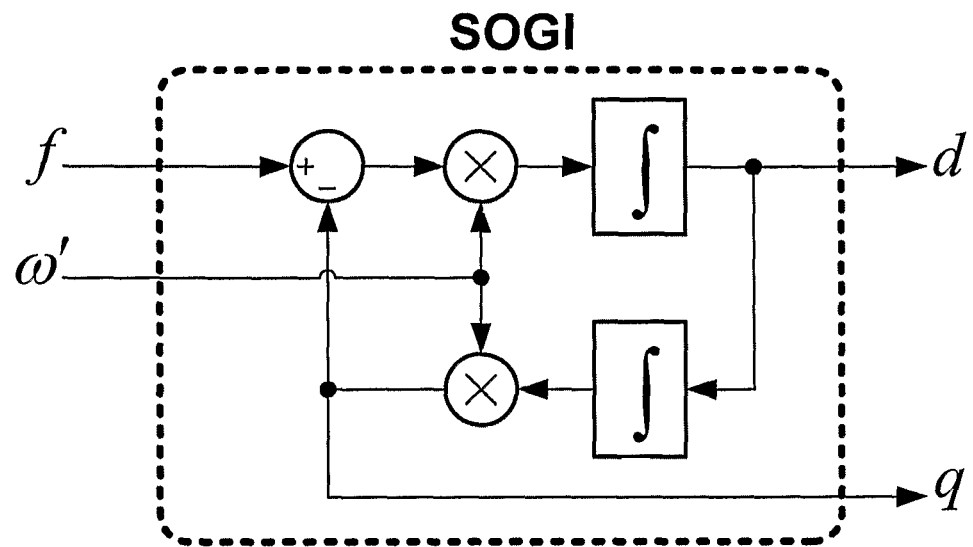
FIG. 13 shows a block diagram of a second order generalized integrator (SOGI)

FIG. 13 illustrates an embodiment of a second-order generalized integrator (SOGI) used in a signal generator employed in the present invention.

Figure 14:
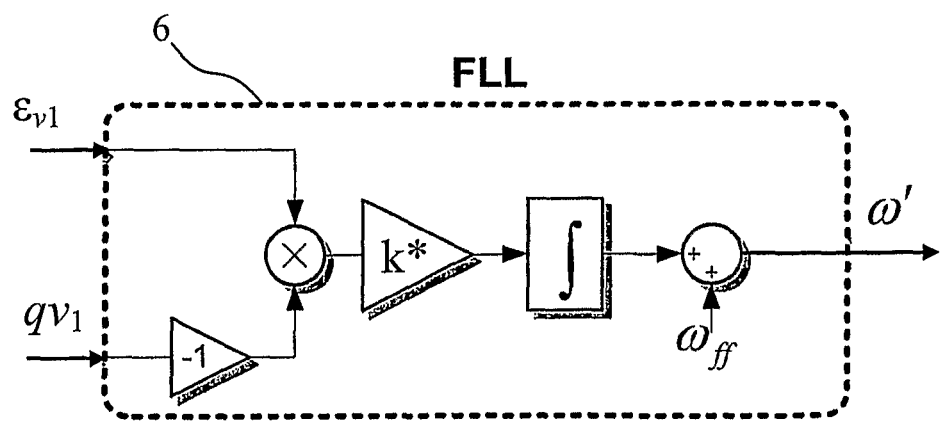
FIG. 14 shows a block diagram of a frequency locking loop unit.

FIG. 14 illustrates an embodiment of the frequency locking loop unit (FLL) 6 in FIG. 1. The product of the negative quadrature signal $qv_1$ and the error signal $\epsilon_{v1}$ of the first harmonic signal is processed by an integrator controller with gain k* to obtain the estimated center frequency. A predetermined fundamental frequency $\omega_f$ may be added to the output of the integrator to form the control frequency $\omega'$.

Figure 15:
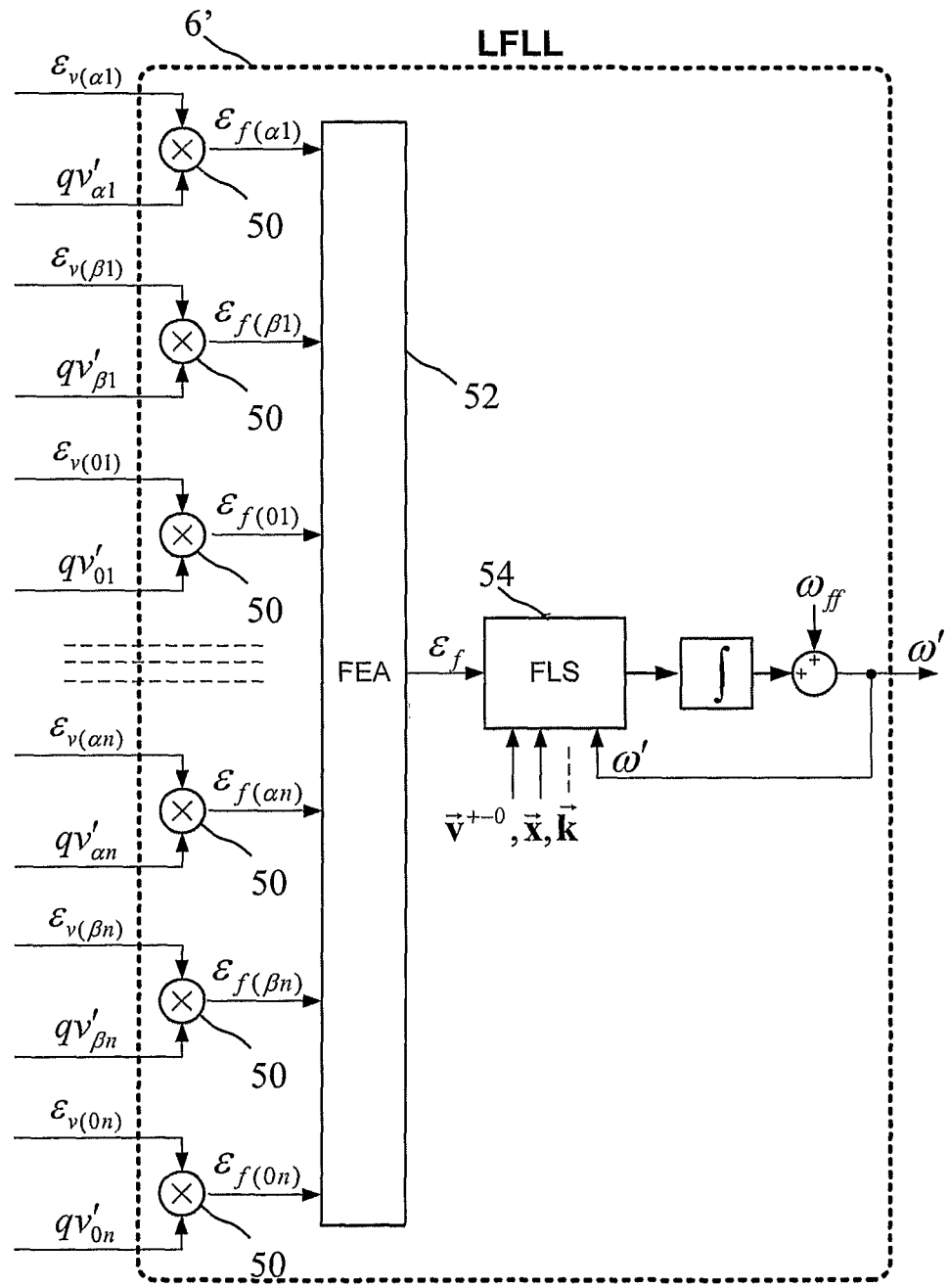
FIG. 15 shows a block diagram of a frequency locking loop unit.

FIG. 15 illustrates an embodiment of the frequency locking loop unit (LFLL). The frequency locking loop unit (LFLL) 6'. The LFFL 6' is a linearized frequency locking loop unit and comprises a number of multipliers 50, a frequency error aggregation block (FEA) 52, and a feedback linearization system unit (FLS) 54. The LFLL has a number of quadrature inputs connected to one or more of the quadrature outputs of harmonic detection unit(s), and a number of error inputs connected to one or more of the error outputs of harmonic detection unit(s). The quadrature input(s) and/or the error input(s) may be connected in different configurations according to number of harmonics, number of input signals to the system and the like.

The total frequency error $\epsilon_f$ is calculated by the FEA based on the outputs of the multipliers 50 and further linearized by the FLS.

The total frequency error $\epsilon_f$ may be given as $$\varepsilon_f = \sum_i a_{\alpha i}\varepsilon_{f(\alpha i)} + a_{\beta i}\varepsilon_{f(\beta i)} + a_{0i}\varepsilon_{f(0i)}$$

where $\epsilon_{f(\alpha i)} = \epsilon_{v(\alpha i)}qv'_{\alpha i}$, $\epsilon_{f(\beta i)} = \epsilon_{v(\beta i)}qv'_{\beta i}$ and $\epsilon_{f(0i)} = \epsilon_{v(0i)}qv'_{0i}$. The variables $a_{\alpha i}$, $a_{\beta i}$, $a_{0i}$ are suitable weighting factors.

The total frequency error $\epsilon_f$ may be given as $\epsilon_f = \epsilon_{f(\alpha 1)} + \epsilon_{f(\beta 1)} + \epsilon_{f(01)}$.

The total frequency error $\epsilon_f$ may be given as $\epsilon_f = \epsilon_{f(\alpha 1)} + \epsilon_{f(\beta 1)}$.

The total frequency error may be calculated from all, preferably selected, frequency components.

In general, the frequency error aggregation block (FEA) implements an optimization function for calculating the collective frequency error at the frequency of interest resulting from the collective action of the frequency components of the monitored input vector. The FEA has a number of inputs to which the output signals from the partial frequency error detectors (multipliers) are coupled, and an output port providing a collective frequency error signal, wherein the output port of the FEA is coupled to the input port of the feedback linearization system (FLS).

The feedback linearization system (FLS) implements a suitable transfer function H for setting the performance of the frequency adaptive loop according to the desired dynamics. The FLS block has an input to which the collective frequency error signal from the FEA is coupled, an input to which the actual value of the detected frequency of interest is coupled. Further, the FLS may comprise a series of additional inputs to which different state variables of the LFLL may be connected. The FLS provides at its output a linearized frequency error signal, wherein the output port of the FLS block is coupled to the input of an linear integrator block.

The transfer function H of the FLS may be given as:

$H = -\Gamma\Phi$, where $\Gamma$ is a constant, e.g. $\Gamma=50$, and $\Phi$ is a normalization factor.

The normalization factor $\Phi$ may be given as:

$$\Phi = \frac{k\omega'}{v_{\alpha 1}^{+2} + v_{\alpha 1}^{-2} + v_{\beta 1}^{+2} + v_{\beta 1}^{-2}}, \text{ where } k = \sqrt{2}.$$

The transfer function of the FLS may depend on or be controlled by the control frequency $\omega'$ and/or the vector $\vec{k}$ comprising one or more of the gain values k of the different signal generators used in the harmonic detection unit(s). In addition or alternatively, the transfer function of the FLS may depend on or be controlled by a vector comprising one or more values of the positive sequence or the negative sequence. The transfer function of the FLS may depend on or be controlled by a vector comprising one or more values of the zero sequence.

The transfer function of the FLS may depend on or be controlled by a control vector $\vec{X}$.

The output of the FLS is fed to an integrator and a preset fundamental frequency $\omega_f$ is added to the output of the integrator. The output of the LFLL is $\omega'$, i.e. the tuning frequency of the harmonic detection unit(s).

The GMS of the present invention does not perform trigonometric calculations, which results in lower computational effort in reference to existing grid monitoring systems.

It is an advantage of the GMS that it can be implemented in standard industrial digital signal processors.

Experimental Test

The three-phase implementation of the grid monitoring system according to the present invention has been evaluated in an experimental set-up. The control algorithm of the GMS was implemented in a control board based on the floating point DSP Texas Instruments TMS320F28335 at 150 MHz (6.67 ns cycle time). The sampling frequency was set to 10 kHz. The unbalanced and distorted input voltage signals were generated by an AC programmable source ELGAR SM5250A. The parameters of the unbalanced and distorted input voltage are described in Table 1 below.

TABLE 1

Parameters of the input voltage

| Voltage component | Value [p.u.] |
|---|---|
| Fundamental frequency positive-sequence | $\vec{V}^{+1} = 0.733 \angle 5°$ |
| Fundamental frequency negative-sequence | $\vec{V}^{+1} = 0.210 \angle 50.4°$ |
| $2^{nd}$ harmonic negative-sequence | $\vec{V}^{-2} = 0.10 \angle 0°$ |
| $3^{rd}$ harmonic zero-sequence | $\vec{V}^{03} = 0.10 \angle 45°$ |
| $4^{th}$ harmonic positive-sequence | $\vec{V}^{+4} = 0.10 \angle 180°$ |
| $5^{th}$ harmonic negative-sequence | $\vec{V}^{-5} = 0.25 \angle 45°$ |
| $7^{th}$ harmonic positive-sequence | $\vec{V}^{+7} = 0.20 \angle 180°$ |
| $11^{th}$ harmonic negative-sequence | $\vec{V}^{-11} = 0.15 \angle 180°$ |

The GMS was implemented by using a transformation unit and two harmonic detection units (HDN), one for each of the α and β components, with seven embedded QSGs in each HDN (one per each harmonic component plus the fundamental one). The computational time of the whole GMS algorithm took 34.86 μs. The QSG including the positive-/negative-sequence calculation for an individual harmonic took 4.26 μs. The cross feedback network of the HDN took 2.087 μs and the LFLL took 1.65 μs.

Figure 16:
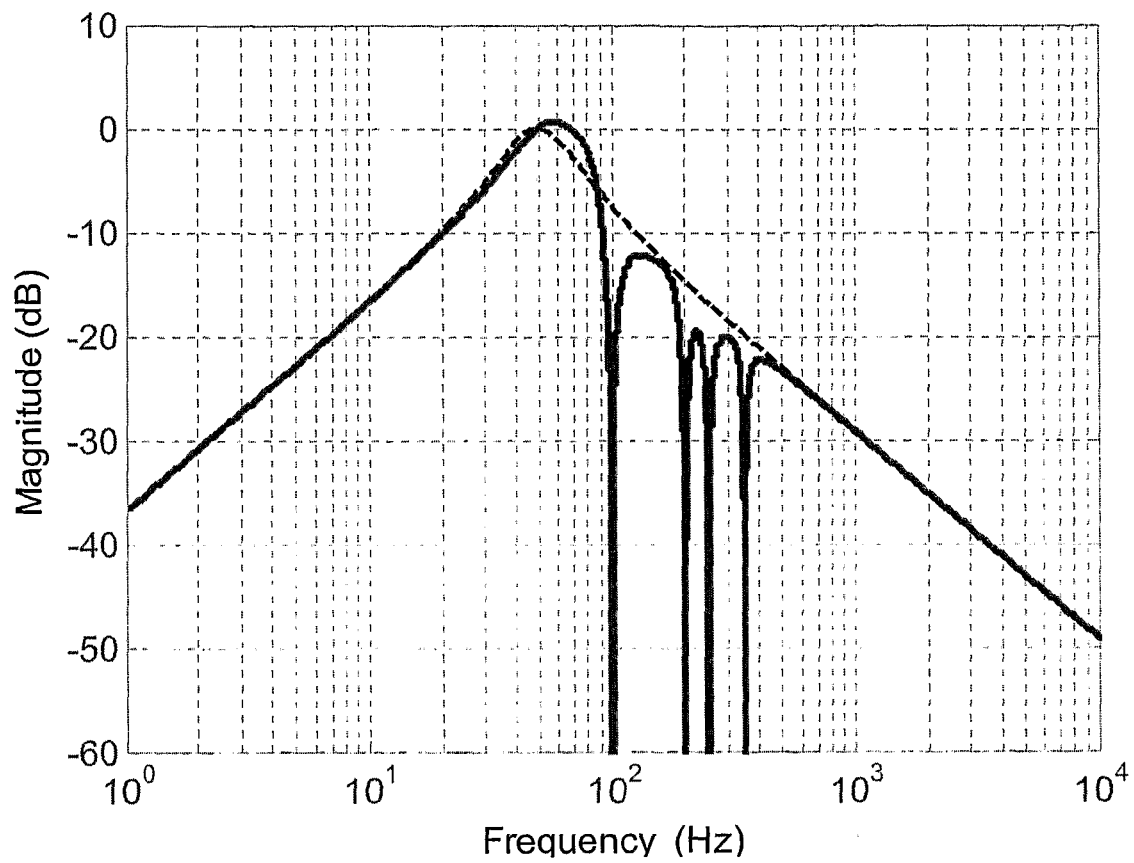
FIG. 16 shows a frequency response of a harmonic detection unit, and FIG. 17 are graphs illustrating experimental results.

FIG. 16 shows the frequency response of the harmonic detection unit for the fundamental component of the monitored signal. It can be appreciated in this figure that the cross feedback structure of the HDN gives rise to several notches in the Bode diagram, which means that the selected harmonics will not have effect on the detection of the fundamental component.

Figure 17:
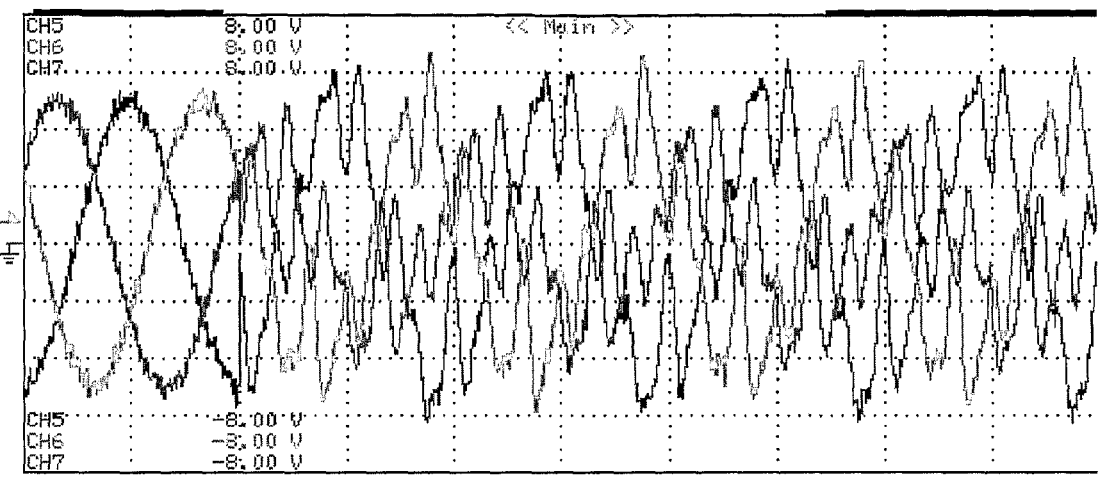
Figure 17:
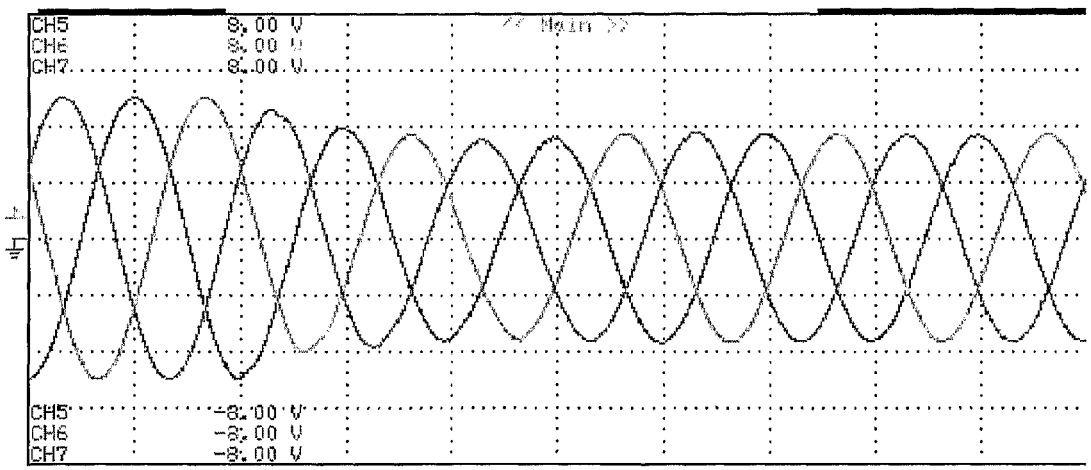
Figure 17:
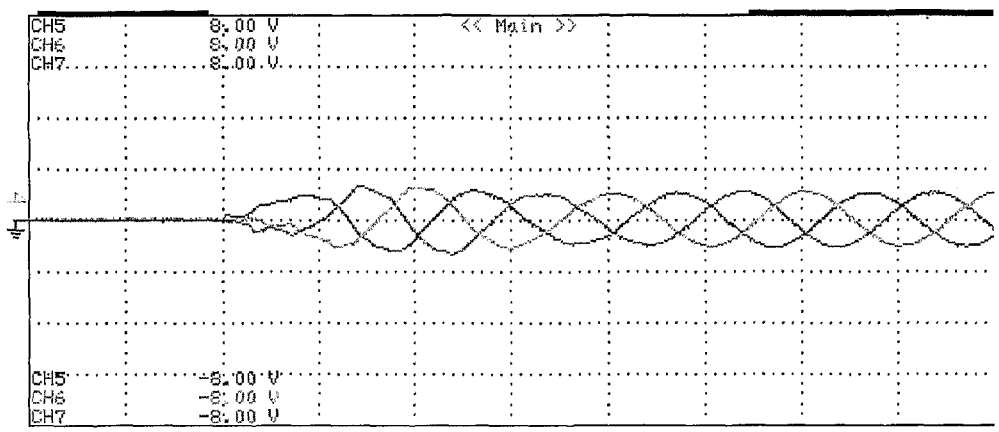
Figure 17:
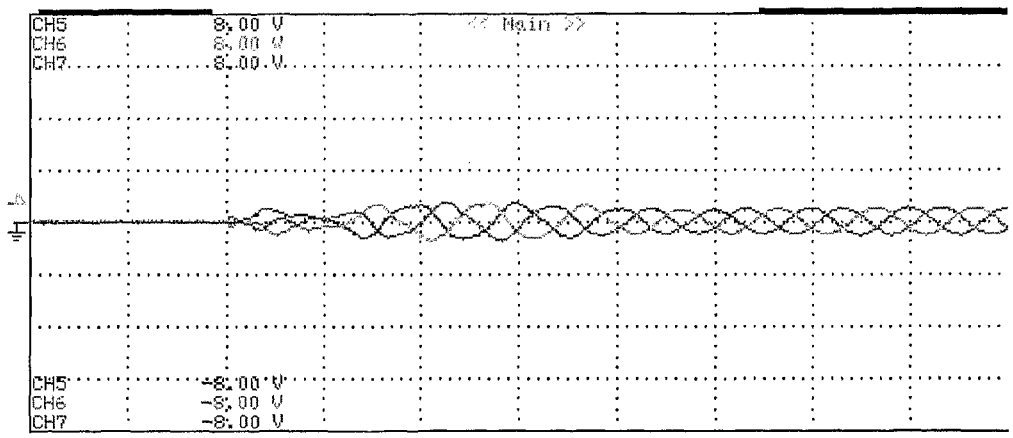
Figure 17:
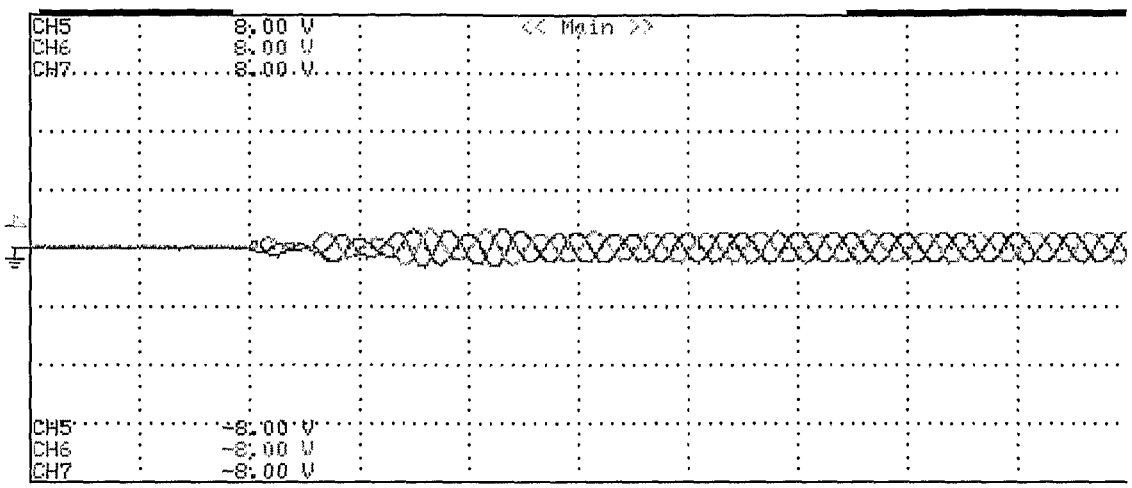
Figure 17:
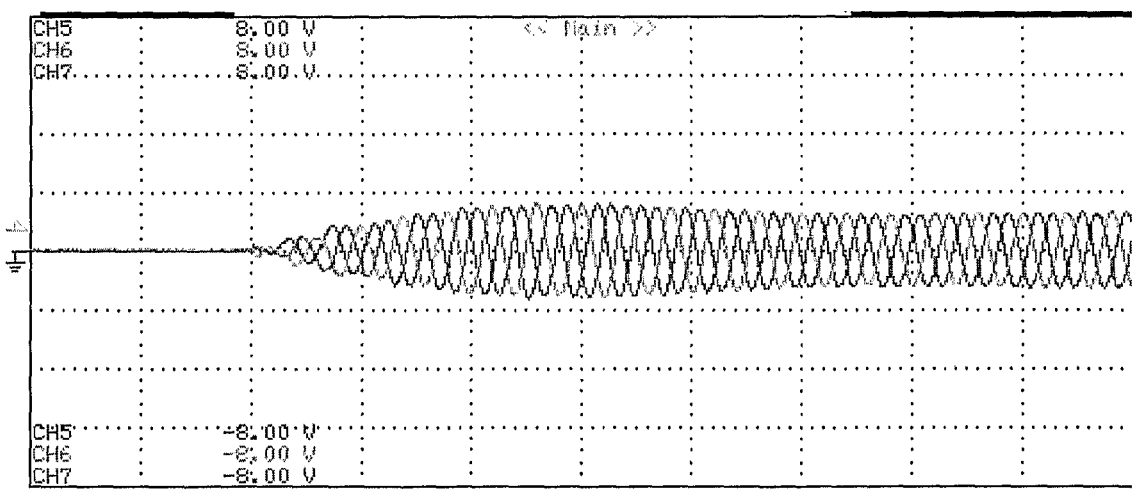
Figure 17:
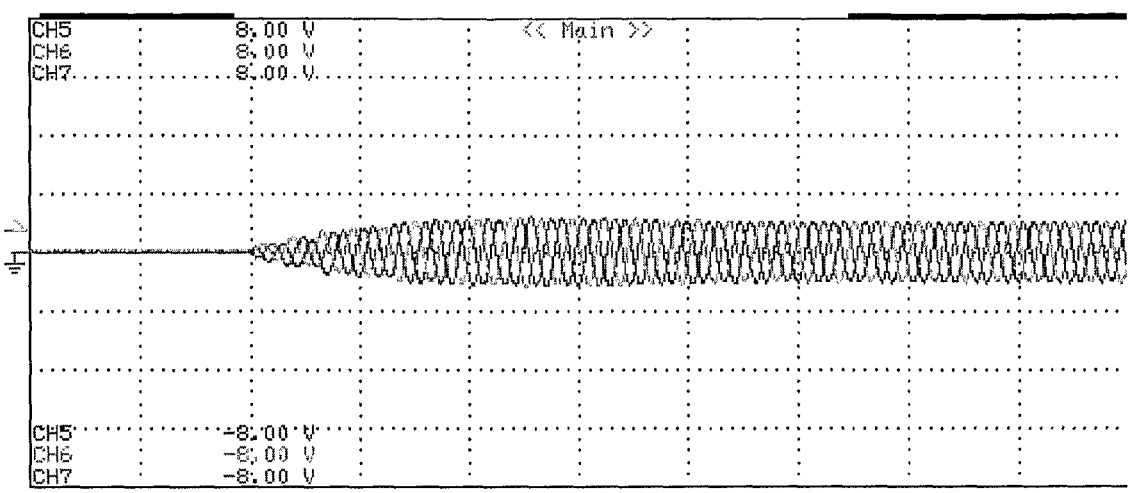

FIG. 17 shows some scopes recorded from the experimental plant, i.e. experimental results regarding the response of the three-phase real-time multi-resonant grid monitoring system in presence of a voltage unbalance and distortion.

FIG. 17(a) shows the input voltage vector, which was unbalanced and extremely distorted. FIGS. 17(b) and 17(c) show the waveforms detected for the positive- and negative-sequence components at the fundamental frequency. FIGS. 17(d), 17(e), 17(f), and 17(g) show the waveforms detected for the 2nd, 4th, 5th, 7th and 11th harmonics, respectively. The waveforms detected for the 3rd harmonic are not shown in FIG. 17 since their amplitude was almost zero—the 3rd harmonic is blocked by the Clarke transformation.

According to the results shown in FIG. 17, it is worth to point out the excellent performance of the GMS, which, in addition to its low computational burden, makes the monitoring system presented in this invention very suitable to be applied in real-time controllers of advanced grid connected equipments like distributed generation systems (DGS), flexible AC transmission systems (FACTS), power quality conditioner (PQC), interruptible power supplies (UPS), real-time power quality analyzers (RT-PQA) and power system protections.

The design of the quadrature signal generator (QSG)) allows real-time adaptation of both the center frequency and the quality factor of its frequency response, which makes possible an adaptive tuning of the GMS behaviour to the characteristics of the processed power signal.

In the GMS according to the present invention, three power signals of a three-phase system are not necessarily processed separately as in some existing solutions. On the contrary, the GMS may use a vector approach on a two-dimensional stationary reference frame which reduces the algorithm complexity and allows calculating the positive- and negative-sequence components of the harmonics of the processed power signal in an easy way.

The GMS may be used for monitoring single or multi-phase electrical power systems. The invention provides an essential real-time signal processing block to be used as a part of complex control system of advanced grid connected equipments such as line interactive power processors, intelligent protection systems, and power quality monitors and analyzers. The GMS is in particular advantageous for the analysis of distorted and unbalanced power signals. A characteristic of the GMS may include the use of a frequency adaptive harmonic detection unit, e.g. based on second order generalized integrators (SOGI), working inside of a cross feedback structure, which detects the frequency of interest of the processed power signals by using a frequency locking loop unit. The result is a very robust and light frequency adaptive system able to synchronize in real-time with the harmonics of a power signal without applying the Fourier analysis. As an advanced feature in the case of three-phase systems, the GMS may be able to detect one or more of the positive-, negative-, and zero-sequence harmonic components of the power signals and synchronize with them in real-time. These features make the GMS according to the invention a very suitable solution to be applied in the control of distributed generation systems (DGS), flexible AC transmission systems (FACTS), power quality conditioner (PQC), interruptible power supplies (UPS), real-time power quality analyzers (RT-PQA) and power system protections. In all these systems, the fast and precise real-time detection of the harmonic components of the voltage and/or current classified by their sequence under abnormal grid operating conditions is a crucial matter.

The GMS according to the present invention is in particular advantageous, when the power in the input signal is divided between harmonics of the signal, e.g. where the fundamental frequency contains less than 90% of the power, The present invention provides a new monitoring system for distorted and unbalanced single and three-phase systems, which is not based on the Fourier analysis, being possible its usage in real-time applications. The Multi-resonant Grid Monitoring System (MRGMS) of the present invention applies a vector approach for detecting the harmonic components of power signals, splitting such harmonics into their positive-, negative- and optionally zero-sequence components. In an aspect of the invention, the harmonic detection unit (HDN) is an essential feature. The harmonic detection unit comprises multiple adaptive band-pass filters based on second-order generalized integrators, namely, the Quadrature Signal Generators (QSG), working inside of a cross feedback structure. The HDN is frequency adaptive, and it is set to the frequency of the processed power signal by means of a linearized frequency locking loop unit (LFLL).

In an aspect of the present invention, a method for operating a grid monitoring system comprising a harmonic detection unit having a first input and a control input and comprising a first signal generator generating at least one first output signal in response to a control signal and an input signal, the harmonic detection unit further comprising a second signal generator generating at least one second output signal in response to a control signal and an input signal, is provided. The method comprises:

feeding an input signal to the first input of the harmonic detection unit, and subtracting an output signal from the first signal generator from the input signal and feed the resulting signal as input signal to the second signal generator.

The method may comprise subtracting an output signal from the second signal generator from the input signal and feed the resulting signal as input signal to the first signal generator.

In an aspect of the invention, the grid monitoring system comprises a harmonic detection unit being adapted to subtract harmonics of an input signal before feeding the input signal to a plurality of signal generators in the harmonic detection unit.

It should be noted that in addition to the exemplary embodiments of the invention shown in the accompanying drawings, the invention may be embodied in different forms and should not be construed as limited to the embodiments set forth herein. Rather, these embodiments are provided so that this disclosure will be thorough and complete, and will fully convey the concept of the invention to those skilled in the art.

The invention claimed is:

1. A grid monitoring system, comprising:
a frequency locking loop unit configured to output a control signal;
a first harmonic detection unit, comprising:
a first input connected to the frequency locking loop unit for receiving the control signal;
a second input for receiving a first input signal; the first harmonic detection unit being configured for detecting at least a first frequency component and a second frequency component of the first input signal;
a first output and a second output for receiving the first frequency component and the second frequency component, respectively;
a third output connected to a first input of the frequency locking loop unit to transmit a first feedback signal to the frequency locking loop unit;
a cross feedback network;
a first signal generator comprising a first input connected to a first output of the cross feedback network, and a first output connected to the first output of the first harmonic detection unit and to a first input of the cross feedback network;
a second signal generator comprising a second input connected to a second output of the cross feedback network, and a second output connected to the second output of the first harmonic detection unit and to a second input of the cross feedback network; wherein the cross feedback network is configured to:
subtract the second frequency component from the first input signal and feed the resulting signal to the first input of the first signal generator, and
subtract the first frequency component from the first input signal and feed the resulting signal to the second input of the second signal generator.

2. A grid monitoring system according to claim 1, wherein the second input of the first harmonic detection unit is connected to a control input of the first signal generator.

3. A grid monitoring system according to claim 1, wherein the first harmonic detection unit comprises an amplifier unit having an input connected to the first input of the first harmonic detection unit and an output connected to a control input of the second signal generator.

4. A grid monitoring system according to claim 1, wherein the first signal generator is a quadrature signal generator generating a first output signal on the first output and a second output signal on a second output connected to a first quadrature output of the first harmonic detection unit.

5. A grid monitoring system according to claim 4, wherein the quadrature signal generator comprises a second order generalized integrator.

6. A grid monitoring system according to claim 1, wherein the first signal generator has a second output connected to a first error output of the first harmonic detection unit.

7. A grid monitoring system according to claim 1, comprising a second harmonic detection unit having at least one input and at least one output, the second harmonic detection unit having a first input for receiving a second input signal, a second input connected to the frequency locking loop unit for receiving a control frequency, wherein an input of the frequency locking loop unit is connected to at least one output of the second harmonic detection unit for receiving a second feedback signal, the second harmonic detection unit being configured for detecting a first frequency component and a second frequency component of the second input signal on the first input of the second harmonic detection unit, wherein the second harmonic detection unit is configured for feeding the first frequency component and the second frequency component to a first output and a second output, respectively, of the second harmonic detection unit, the second harmonic detection unit comprising a first signal generator, a second signal generator and a cross feedback network, the first signal generator having a first input connected to a first output of the cross feedback network and a first output connected to a first output of the second harmonic detection unit and to a first input of the cross feedback network, and the second signal generator having a second input connected to a second output of the cross feedback network and a second output connected to a second output of the second harmonic detection unit and to a second input of the cross feedback network, wherein the cross feedback network is configured to subtract the second frequency component from the second input signal and feed the resulting signal to the first input of first signal generator, and wherein the cross feedback network is configured to subtract the first frequency component from the second input signal and feed the resulting signal to the second input of second signal generator.

8. A grid monitoring system according to claim 7, comprising a positive-negative sequence calculator unit connected to outputs of the first and second harmonic detection units and being configured to provide the positive and negative-sequence components at the first and second frequencies.

9. A grid monitoring system according to claim 1, wherein one or more inputs of the frequency locking loop unit is connected to one or more quadrature outputs of the first harmonic detection unit.

10. A grid monitoring system according to claim 1, wherein one or more inputs of the frequency locking loop unit is connected to one or more error outputs of the first harmonic detection unit.

11. A grid monitoring system according to claim 1, wherein the frequency locking loop unit is a linearized frequency locking loop unit.

12. A grid monitoring system according to claim 11, wherein frequency locking loop unit comprises a number of multipliers having one or more outputs connected to a frequency error aggregation block and a feedback linearization system unit.

13. A grid monitoring system according to claim 1, comprising a transformation unit having at least one input and at least one output and being configured for transforming the signal(s) on the at least one input to signal(s) on the at least one output according to a transformation.

14. A harmonic detection unit for use with a frequency locking loop unit in grid monitoring system, wherein the frequency locking loop unit is configured to output a control signal, the harmonic detection unit comprising:

a first input connected to the frequency locking loop unit for receiving the control signal;

a second input for receiving a first input signal; the harmonic detection unit being configured for detecting a first frequency component and a second frequency component of the first input signal;

a first output and a second output for receiving the first frequency component and the second frequency component, respectively;

a third output connected to a first input of the frequency locking loop unit to transmit a first feedback signal to the frequency locking loop unit;

a cross feedback network;

a first signal generator comprising:
  a first signal generator input connected to a first cross feedback network output of the cross feedback network; and
  a first signal generator output connected to the first output and to a first cross feedback network input of the cross feedback network; and a second signal generator comprising:
  a second signal generator input connected to a second cross feedback network output of the cross feedback network; and
  a second signal generator output connected to the second cross feedback network output of the harmonic detection unit and to a second cross feedback network input of the cross feedback network;

wherein the cross feedback network is configured to:
  subtract the second frequency component from the first input signal and feed the resulting signal to the first signal generator input of the first signal generator, and
  subtract the first frequency component from the input signal and feed the resulting signal to the second signal generator input of the second signal generator.

15. The harmonic detection unit of claim 14, wherein the second input of the harmonic detection unit is connected to a control input of the first signal generator.

16. The harmonic detection unit of claim 14, further comprising an amplifier unit having an input connected to the first input and an output connected to a control input of the second signal generator.

17. The harmonic detection unit of claim 14, wherein the first signal generator is a quadrature signal generator generating a first output signal on the first signal generator output and a second output signal on a second signal generator output connected to a first quadrature output of the harmonic detection unit.

18. The harmonic detection unit of claim 17, wherein the quadrature signal generator comprises a second order generalized integrator.

* * * * *